United States Patent
Reis et al.

(10) Patent No.: US 6,807,644 B2
(45) Date of Patent: Oct. 19, 2004

(54) JTAG TESTING ARRANGEMENT

(75) Inventors: Ilkka Reis, Tampere (FI); Mikko Simonen, Tampere (FI)

(73) Assignee: Patria Advanced Solutions Oy, Tampere (FI)

( * ) Notice: Subject to any disclaimer, the term of this patent is extended or adjusted under 35 U.S.C. 154(b) by 383 days.

(21) Appl. No.: 09/946,811

(22) Filed: Sep. 5, 2001

(65) Prior Publication Data

US 2002/0049558 A1 Apr. 25, 2002

(30) Foreign Application Priority Data

Sep. 14, 2000 (FI) .............................................. 20002029

(51) Int. Cl.⁷ .............................................. G01R 31/28
(52) U.S. Cl. ...................................................... 714/724
(58) Field of Search ................................. 714/724, 725, 714/726, 727, 731, 738; 324/765; 4/158.1; 370/338, 905

(56) References Cited

U.S. PATENT DOCUMENTS

| | | | |
|---|---|---|---|
| 5,414,698 A | 5/1995 | Adams | 370/17 |
| 5,481,186 A | 1/1996 | Heutmaker et al. | 324/158.01 |
| 5,630,048 A | 5/1997 | La Joie et al. | 395/183.01 |
| 5,852,617 A | 12/1998 | Mote, Jr. | 371/22.31 |
| 6,157,817 A | 12/2000 | Norin et al. | 455/67.1 |
| 6,532,561 B1 * | 3/2003 | Turnquist et al. | 714/738 |
| 6,557,128 B1 * | 4/2003 | Turnquist | 714/724 |

FOREIGN PATENT DOCUMENTS

| | | |
|---|---|---|
| EP | 0 636 976 | 2/1995 |
| EP | 0 862 063 | 9/1998 |
| EP | 0 977 461 | 2/2000 |

OTHER PUBLICATIONS

"ILEE Standard Test Access Port and Boundary–Scan Architecture." ILEE STD. 1149.1–1990 (Includes IEEE STD 1149.1A–1993), IEEE (1993) Entire Document.
"Supplemental to IEEE STD 1149.1–1990, IEEE Standard Test Access Port and Boundary–Scan Architecture" IEEE STD 1149.1–1994 Supply IEEE (1995) Entire Document.

* cited by examiner

Primary Examiner—Albert Decady
Assistant Examiner—James Kerveros
(74) Attorney, Agent, or Firm—Ladas & Parry

(57) ABSTRACT

A JTAG testing system including a JTAG test equipment and a device under test compatible with the JTAG configured to form a synchronous data transmission connection with one another for transferring test data through a transmission path placed between predetermined interfaces. An asynchronous connection can be used as the transmission path between the interfaces, whereby the test equipment and said device under test are provided with a transceiver on the transmission path side configured to arrange the test data to be sent from said interface into a mode appropriate for an asynchronous transmission path and correspondingly to arrange the test data to be received from the asynchronous transmission path into a synchronous mode required by said interface.

20 Claims, 2 Drawing Sheets

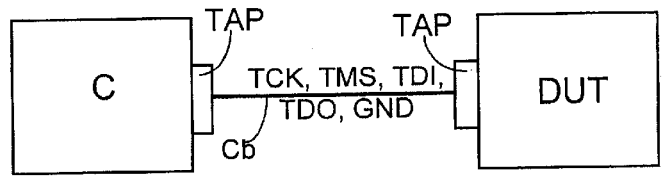
PRIOR ART  FIG. 1
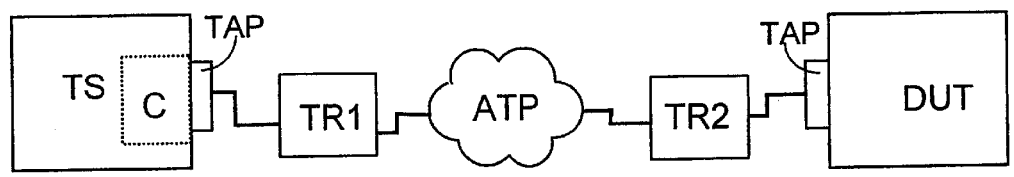
FIG. 2
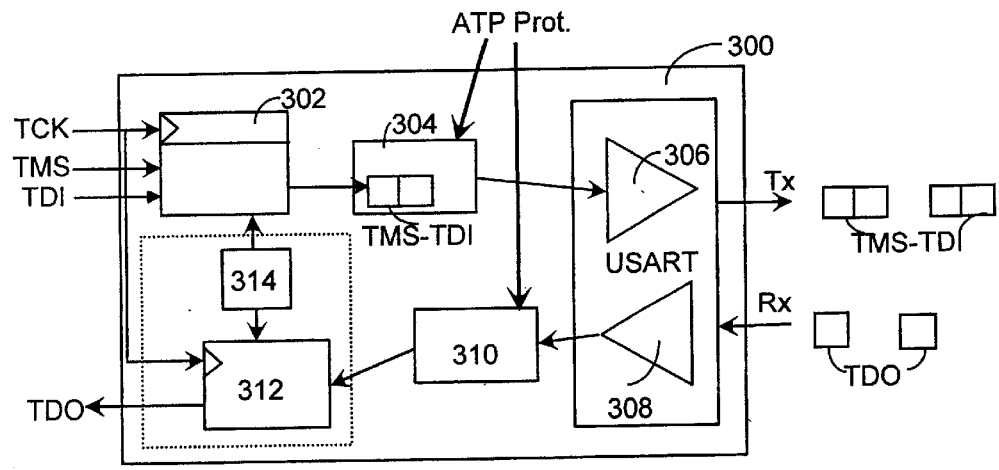
FIG. 3
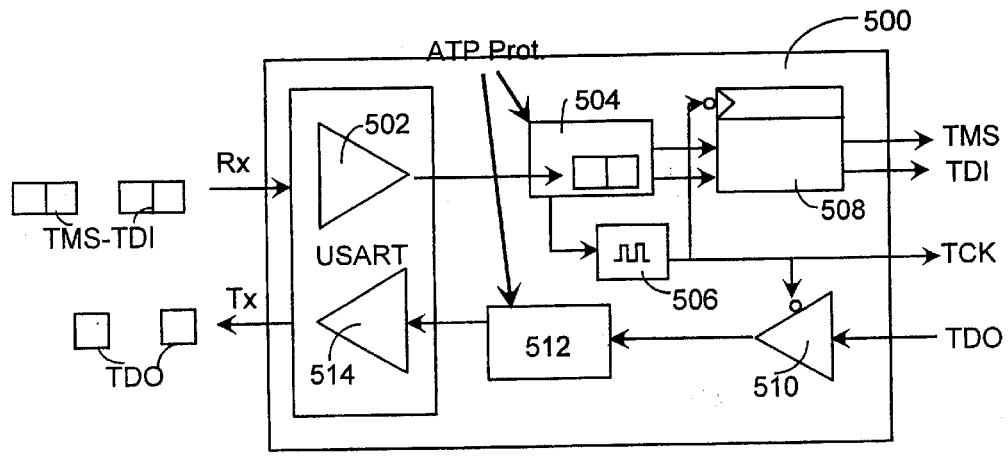
FIG. 5

JTAG TESTING ARRANGEMENT

BACKGROUND OF THE INVENTION

The invention relates to JTAG testing, and more particularly to widening the area where JTAG testing can be applied.

A generally used standard IEEE 1149.1, also known as JTAG (Joint Test Action Group) according to the consortium that prepared the standard, has been created for testing different circuit boards and components connected thereto as well as integrated circuits. The JTAG is a boundary scan method, in which an input signal is fed into a boundary pin of the circuit board and an output signal is measured from another boundary pin. The basic idea of the JTAG is to transfer predetermined data sequences in series through IC components in a circuit board or in a part thereof and to sample the output data. As the topology and logical functions of the components of the circuit board to be tested are known in advance, an assumed output can also be determined. Test equipment may be used to compare the output data of a Device Under Test DUT with the assumed output and if they correspond with one another the device under test DUT operates correctly. If, in turn, the output data does not correspond with the assumed output, the circuit to be tested may be open, an outside signal may be connected thereto or a component in the circuit may be defective. In such a case, the defect can typically be determined by running different test data sequences through the device under test and by analysing the obtained output using software included in the test equipment.

The JTAG standard determines for both the test equipment comprising a JTAG controller and the device under test DUT an identical interface Test Access Port TAP, with a fixed synchronous line between them comprising at least five conductors for five compulsory signals: a Test ClocK signal TCK, a Test Mode Select signal TMS, Test Data Input TDI, Test Data Output TDO and a Ground reference signal GND. In addition according to the JTAG standard the line may be used for optionally conveying also a Test ReSeT signal TRST. The device under test DUT and the test equipment are placed close to one another so that they can be connected together with a cable comprising said at least five conductors and forming a synchronous line, and thereafter the testing of the device can be started.

A problem with the above arrangement is the testing of such devices to which test equipment is difficult or impossible to arrange with a fixed connection. This is emphasized, for example in space technology, where the chance to easily test circuit boards and to analyse defects is particularly important. For example, the defects that appear on a telecommunication satellite launched into the orbit must be analysed as quickly as possible. The satellites and other devices associated with space technology are typically kept as simple and light as possible, in which case a fixed installation of the test equipment to the devices is not to be desired. Consequently a need arises to test the circuit boards with the test equipment using remote control, without a fixed connection to the device under test.

What becomes a problem is then the synchronous line determined in accordance with the JTAG standard between the JTAG controller of the test equipment and the test access ports TAP of the device under test DUT. If the test equipment and device under test DUT are located far from one another, information between these two can typically only be transferred using an asynchronous and often wireless connection. Thus, the use of the test equipment according to the JTAG standard for testing circuit boards using remote control is impossible.

BRIEF DESCRIPTION OF THE INVENTION

It is an object of the invention to provide a system and an apparatus so as to solve the above problems. The objects of the invention are achieved with the system and apparatus, which are characterized in what is disclosed in the independent claims.

The preferred embodiments of the invention are disclosed in the dependent claims.

The invention is based on the fact that a fixed synchronous line restricting the JTAG standard-based testing can be avoided by employing transceivers both in test equipment and a device under test DUT. The transceivers arrange the signals arriving from a test access port TAP to be transferred through an asynchronous transmission path so that the received signals can again be synchronized into the mode required by the test access port TAP.

The system according to the invention provides significant advantages. The arrangement of the invention allows to carry out JTAG testing also in remote operation mode without a synchronous data transmission connection between the test equipment and the device under test. Existing IEEE1149.1 standard JTAG controllers and software thereof can be used in testing. A further advantage of the invention is that the structure of the transceivers allowing an asynchronous connection can be designed to be simple and economical, and the chances to employ JTAG testing can therefore be increased considerably. A still further advantage of a preferred embodiment of the invention is that an internal delay arrangement in the transceivers can be used to employ the test arrangement on different asynchronous connections, which may have different delays, in which case testing can also be carried out using connections which are slow in relation to a clock signal.

BRIEF DESCRIPTION OF THE DRAWINGS

In the following the invention will be described in greater detail with reference to the accompanying drawings, in which FIG. 1 shows a prior art arrangement for performing JTAG testing, FIG. 2 shows an arrangement of the invention for using an asynchronous transmission path in JTAG testing, FIG. 3 shows the structure of an uplink transceiver according to a preferred embodiment of the invention, FIG. 5 shows the structure of a downlink transceiver according to a preferred embodiment of the invention.

DETAILED DESCRIPTION OF THE INVENTION

Figure 4:
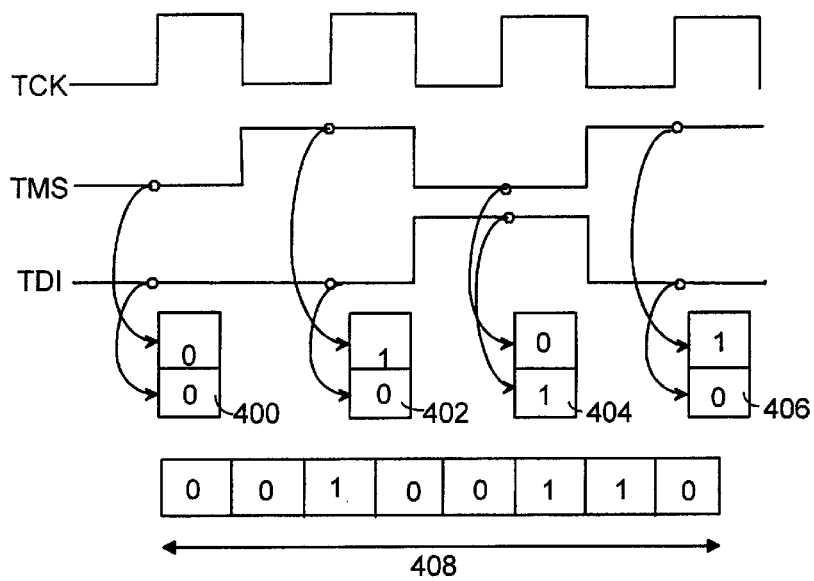
FIG. 4 shows the sampling of a test signal according to a preferred embodiment of the invention in synchronization with a clock signal.

FIG. 1 shows a prior art arrangement for testing a device under test DUT using test equipment comprising a JTAG controller. Both the JTAG controller C and the device under test DUT comprise a test access point TAP according to the JTAG definition, through which the JTAG controller and the device under test DUT are connected using a cable Cb offering a synchronous connection. The cable Cb allows to transfer from the JTAG controller to the device under test DUT at least three signals, a test clock signal TCK, a test mode select signal TMS and test data input TDI. Furthermore, from the device under test DUT test data output TDO is transferred to the JTAG controller and from thereon further to the test software of the test equipment for analysis. In addition to these, the line should also include a ground reference conductor GND and the line can be optionally used to transfer also a test reset signal TRST. In addition to testing the arrangement according to JTAG standard can also be used for analysing defects or for programming an exterior apparatus.

Both the JTAG controller and the device under test comprise Boundary Scan Cells BSC typically formed from shift registers, the BSCs being chained in accordance with the control of an Instruction Register IR. A boundary scan register transferring test data between various BSC cells controls the operation of the boundary scan cells BSC. A TAP controller, which is a state machine comprising 16 different operating states, controls the boundary scan register. The TAP controller states are, in turn, controlled using an incoming test clock signal TCK and a test mode select signal TMS. In addition, the JTAG controller comprises a By-Pass Register BPR and possibly other data registers. By means of the by-pass register BPR the test data input TDI can, if necessary, be rapidly transferred through the device under test DUT by passing the boundary scan register. The test data input TDI sequence, which was shifted through the boundary scan cells BSC, is synchronized with the test data output TDO. If several circuits to be tested are tested at the same time, the circuits should also comprise JTAG controllers in order to be able to synchronize the data transfer between the circuits. The test equipment typically comprises an exterior control device, such as a personal computer PC, by which the JTAG controller can typically be controlled. A Boundary Scan Description Language BSDL can be used to control the JTAG controller and to describe and define different testing situations. A BDSL description is also stored into the memory of a computer for each circuit to be tested and for the components thereof.

A fixed synchronous line restricting the testing according to the JTAG standard can in accordance with the invention be avoided in such a manner that both the test equipment and the device under test DUT employ transceivers, which arrange the signals arriving from the test access port TAP to be transferred through the asynchronous transmission path so that the received signals can again be synchronized into the mode the TAP requires.

This is illustrated in FIG. 2. Transceivers TR1 and TR2, which arrange the signals to be transmitted to an asynchronous transmission path ATP and synchronize the received signals into a mode according to the TAP definition, are connected to the side of the transmission path of the test access ports TAP of the device under test DUT and the test equipment TS comprising the JTAG controller C. The uplink transceiver TR1 connected to the JTAG controller in the test equipment sends test mode select signal TMS and test data input TDI to the transmission path and synchronizes the test data output TDO received from the device under test DUT to be in synchronization with the test data input TDI as required by the test access port TAP. The test clock signal TCK is not preferably transferred through an asynchronous path, instead the test clock signal TCK is generated by the downlink transceiver TR2, which receives the test mode select signal TMS and the test data input TDI and generates on these basis the test clock signal TCK as described below. The transceiver TR2 also synchronizes the test data output TDO and arranges this to be sent through the asynchronous transmission path ATP to the transceiver TR1.

Said asynchronous transmission path may as such be wireless or wired. What is essential is to arrange the signals transferred on the transmission path into the mode according to the TAP definition so that the transmission path to be used is transparent both to the JTAG controller and to the device under test DUT. The data transmission protocol to be used on the transmission path is not significant either as regards the implementation of the invention, since arranging the signals to be used in JTAG testing to any known data transmission protocol is obvious for those skilled in the art.

In the following a possible implementation of an uplink transceiver 300 according to the invention is described by means of FIG. 3. A test clock signal TCK, a test mode select signal TMS and test data input TDI, which are forwarded to a packing unit 302, are supplied into the transceiver 300 from the test access port TAP of the JTAG controller. The object of the packing unit 302 is to pack the test mode select signal TMS and the test data input TDI in synchronization with the test clock signal TCK into packets, which can, if necessary, be further arranged to a higher data transmission protocol (ATP protocol) in an encoder 304 to be used on the transmission path. The data to be sent is further input to a transmitter 306 that forwards the data to the transmission path.

Correspondingly the test data signal arriving from the transmission path is received in a receiver 308, and thereafter the received signal is decoded in a decoder 310, in which case the actual test data output TDO can be distinguished from the higher data transmission protocol used on the transmission path. Thus, a transmission path-specific transceiver is always used as the actual transceiver part (306, 308). Said transceiver is dependent on the physical implementation of the transmission path, typically also on the protocol implementation of the transmission path, and as a principled implementation of the invention the transceiver can be described using a Universal Synchronous/Asynchronous Receiver Transmitter USART. For example, in connection with wireless data transmission, the radio frequency parts of the transceiver part must be arranged in accordance with data transmission protocol to be used. Furthermore, an additional communication protocol that allows to change the conventional data signalling between the transmitter and receiver to JTAG testing and vice versa can preferably be implemented in the transmission protocol to be used, whereby the data transmission is preferably always restricted to either purpose.

The test data output TDO is input to a delay circuit 312, which provides the test data output TDO with a required synchronous delay so that the test data output TDO signal to be input to the test access port TAP is synchronized with the test data input TDI in accordance with the access port definition. The delay circuit 312 is controlled using the time clock signal TCK and a boundary scan state machine 314. The boundary scan state machine 314 is preferably at least partly compatible with the JTAG controller and comprises at least the basic functions of the boundary scan description language BSDL of the JTAG standard, which allow the state machine to be connected to the JTAG controller as a part of the boundary scan cell BSC chain to be controlled. The length of the delay to be used depends on the circuit to be tested and on the delay occurring on the transmission path. As to the boundary scan description language BSDL, both the delay circuit 312 and the state machine 314 should logically form a part of the device under test DUT, even though it is located in the uplink transceiver connected to the JTAG controller (depicted with a dashed line). This is due to the fact that in conventional testing according to the JTAG standard the delay formed in the test data output TDO is created using the boundary scan cell BSC chain of the device under test DUT, in which case the TAP controller controls the creation of the delay.

The structure of the uplink transceiver can thus be easily implemented, either as a transceiver integrated to an already existing test equipment or as a separate device that is connected between the JTAG controller of the test equipment and the transmission path. As to the implementation of the uplink transceiver, size, costs or the complexity of the structure are not generally as unconditional criteria as in the downlink transceiver.

In accordance with a preferred embodiment the time clock signal is not sent to the device under test DUT, the clock signal is instead generated on the basis of the test mode select signal TMS and the test data input TDI received in the downlink transceiver. The signal is always delayed on an asynchronous transmission path, and the exact timing between the JTAG controller and the generated clock signal is therefore naturally lost, but the bit-specific synchronization of the TMS and TDI signals to be transferred is maintained in relation to the clock signal.

This is described in the diagram shown in FIG. 4, where the sampling of the test mode select signal TMS and the test data input TDI is described in synchronization with the test clock signal TCK. The TMS and TDI signals must be packed in such a manner that the samples remain undivided during transfer in relation to time. In accordance with FIG. 4, the sampling always occurs at the rising edge of the clock signal, whereby one clock signal sequence is described by means of a two-bit presentation (400 to 406) comprising the values of the TMS and TDI signals at the rising edge of the clock signal. These two-bit fields can further be connected, for example regarding a four clock signal sequence, to eight-bit bytes (408), in which case the data can easily be arranged to be transferred for example in accordance with the RS-232 definition through a universal synchronous/asynchronous receiver-transmitter USART.

A possible implementation of a downlink transceiver 500 according to the invention is described in FIG. 5. The object of the downlink transceiver 500 is to generate the TMS and TDI signals from the received TMS-TDI packets, to generate an internal clock signal in synchronization with the received TMS and TDI signals and to forward the test data output TDO obtained from the output of the boundary scan cell chain of the device under test to the transmission path. The TMS-TDI packets arriving from the transmission path are received in a receiver 502, and thereafter the received signals are decoded in a decoder 504, and then the packets formed of the test mode select signal TMS and the test data input TDI can be distinguished from the higher data transmission protocol (ATP protocol) used on the transmission path. The TMS-TDI packets are used to synchronize a local oscillator 506, which is used to generate an internal test clock signal TCK. The local oscillator is substantially synchronized to the same frequency with the clock signal of the JTAG controller by ensuring that a clock signal sequence is created for a TMS-TDI packet. In an unpacking unit 508 the TMS and TDI signals are distinguished from one another and sent to the test access port TAP of the device under test DUT in synchronization with the falling edge of the test clock signal TCK fed by the local oscillator. The state machines of the device under test DUT are in turn controlled at the rising edge of the test clock signal TCK.

The test data output TDO from the test access port TAP of the device under test DUT is applied through a clock signal synchronization 510 to an encoder 512, which if necessary arranges the signal TDO further to a higher data transmission protocol used on the transmission path. The coded data is applied to a transmitter 514 that forwards the data to the transmission path.

Thus the structure of the downlink transceiver can preferably be kept fairly simple. Depending on the structure of the device under test DUT, the downlink transceiver can be implemented using discrete components or it can be programmed to function as a part of a field programmable gate array FPGA or a programmable logic device PLD, for example using VHSIC hardware description language, VHDL. In this way, the transceiver can be implemented as a small-size device that is inexpensive to manufacture, and that does not interfere with the other functions of the device under test.

One of the basic ideas of the invention is to be able to use already existing JTAG controllers according to the IEEE 1149.1 standard and the software thereof. Especially when higher clock signal frequencies are used, the delays occurred on the transmission path cause the fact that in order to achieve the synchronization required by the test access port TAP, the uplink transceiver must be provided with the formation of a delay to the received test data output TDO before inputting the test signal to the test access port TAP. If the transmission path delay in one direction is shorter than half the clock signal sequence employed, then the received test signal TDO could be synchronized to the test access port TAP without requiring any particular arrangements. Such short delays are not achieved in practice especially not at higher clock frequencies.

It is therefore essential that the uplink transceiver is arranged to form a delay of an appropriate length for the received test signal TDO before the TDO signal is input to the JTAG controller. This can in accordance with a preferred embodiment of the invention be implemented using a virtual boundary scan cell chain in such a manner that an additional "virtual" boundary scan cell chain, which is implemented to the uplink transceiver, is connected to the boundary scan cell chain of the device under test DUT. When such a "virtual" boundary scan cell chain is added to the BSDL description of the device under test DUT comprising the JTAG controller, the entire boundary scan cell chain seems longer as regards the JTAG controller than what it is in reality, and the transfer of the actual TDO signal is delayed to such an extent that the transmission path delay can be compensated.

Figure 6:
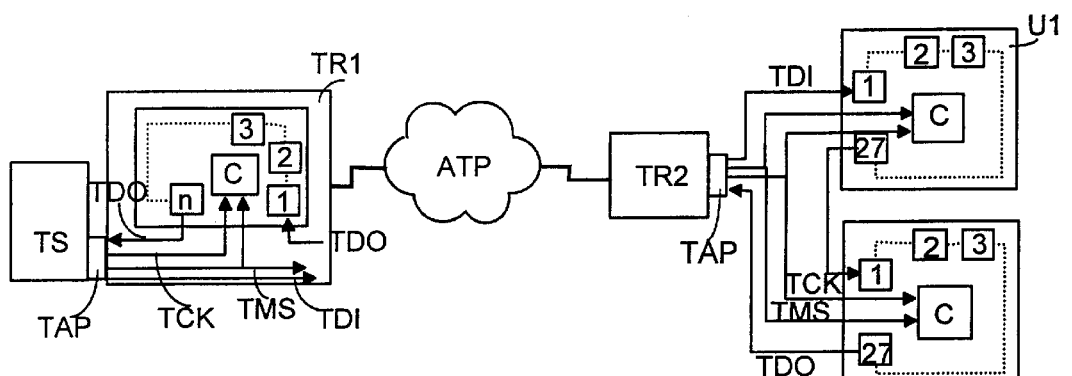
FIG. 6 shows the principle of a virtual boundary scan cell chain.

The principle of the virtual boundary scan cell chain is illustrated by means of the arrangement shown in FIG. 6. The boundary scan cell chain of the device under test DUT comprises two JTAG compatible circuits U1 and U2, which both comprise a JTAG controller C and the boundary scan register thereof comprises 27 boundary scan cells BSC. When test data input TDI sequence is moved from the test equipment TS through said circuits, the JTAG controller of the test equipment requires a correct response from the TDO signal on each clock signal sequence after the test data input TDI sequence is transferred through all 54 cells (54 clock sequences). If the clock signal sequence is shorter than the total delay (uplink+downlink) the synchronization of the TDO signal to the TDI signal is lost and the JTAG testing can no longer be carried out.

When a new "virtual" circuit comprising n boundary scan cells is added to the BSDL description of the device under test DUT at the end of the scan chain, the transfer of the TDO signal to the test access port TAP is delayed to such an extent that the delays of the transmission path can be compensated and the TDO signal can be transferred to the test access port TAP in synchronization with the TDI signal. In other words, the TDO signal is transferred to the uplink transceiver, when said 54 clock sequences have elapsed, but since the JTAG controller assumes that the boundary scan cell chain comprises 54+n cells, the TDO signal is not transferred to the test access port TAP until 54+n clock sequences have elapsed.

The number of boundary scan cells in the virtual circuit, i.e. the value of variable n, can preferably be determined separately for each test situation, in which case the delays that must be considered when determining the value of variable n include delays created in the encoding and decoding required by the higher data transmission protocols, transmission path delays and TAP interface synchronization delay of the TDO signal. In addition, such situations may occur during testing, where test data must be buffered also in the device under test, which should also be taken into account as a delay. When determining the value of variable n, the variation of the delays created on the asynchronous transmission path can also be taken into account, in which case the value of variable n can preferably be set higher than what the sum of the previously mentioned delays requires.

Figure 7:
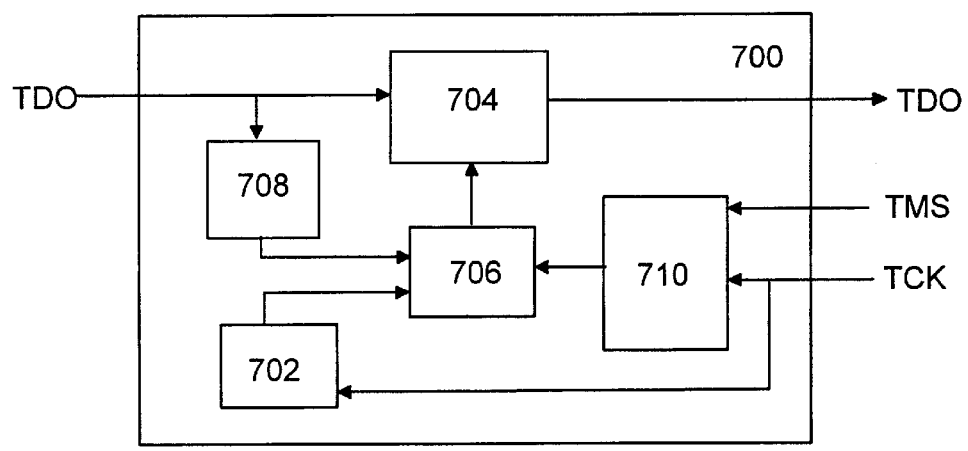
FIG. 7 shows the implementation of the virtual boundary scan cell chain according to a preferred embodiment.

In practice the delay provided by the virtual circuit can be implemented for example using a solution shown in FIG. 7. In such a case the delay circuit 700 including a virtual circuit comprising n boundary scan cells is in practice a counter 702, the value of which is increased in synchronization with the clock signal of the JTAG controller in the test equipment. The test data output TDO arriving from the device under test is set into a buffer 704, which is controlled by an internal state machine 706. The state machine 706 obtains the amount of incoming data from the counter 708 and observes the value of the counter 702. When the value obtains the determined value n, the state machine 706 controls the buffer to release the buffered TDO data to the test access port TAP. In order to be able to set value n from the test equipment using BSDL language, the delay circuit 700 must also comprise a state machine 710 at least partly according to the IEEE1149.1 standard that further controls the internal state machine 706 and sets value n thereto.

Alternatively the generation of the delay can be implemented so as to use the BSDL software of the test equipment for programming to the existing circuits and to the components thereof additional operations, which in reality are zero operations, in which data is not processed during a clock sequence except by transferring it to the following cell. Consequently the definition of n zero operations to the boundary scan cell chain provides a situation, in which the JTAG controller assumes that the boundary scan cell chain is longer than what it actually is, and the delays in the system can thus be compensated and the synchronization required by the test access port TAP can be ensured. Therefore, the manner used to create a delay to the TDO signal for synchronization is not relevant. What is relevant is that the JTAG controller is made to assume that the boundary scan cell chain is longer than what it is in reality.

The invention has above been described in connection with wireless data transmission. However, the invention is not restricted to wireless asynchronous data transmission only but can be implemented using any asynchronous data transmission connection such as a twin cable connection. Thus, the invention can be applied for example to test an Internet router using remote control through a conventional IP-based connection.

It is obvious for those skilled in the art that as technology progresses the basic idea of the invention can be implemented in a number of ways. The invention and the preferred embodiments thereof are therefore not restricted to the above examples but may vary within the scope of the claims.

What is claimed is:

1. A JTAG testing system comprising a JTAG test equipment and a device under test compatible with the JTAG configured to form a synchronous data transmission connection with one another for transferring test data through an asynchronous transmission path between predetermined interfaces, wherein the test equipment and the device under test comprise a transceiver configured on the side of the transmission path, the transceiver being configured to arrange the test data to be sent from said interface into a mode appropriate for an asynchronous transmission path and correspondingly to arrange the test data arriving from the asynchronous transmission path to be received into a synchronous mode required by said interface.

2. A system as claimed in claim 1, wherein the transceiver in said test equipment is configured to send test mode select signal and test data input to the transmission path and to synchronize the test data output received from the device under test in synchronization with the test data input required by said interface.

3. A system as claimed in claim 2, wherein the transceiver in said test equipment comprises a packing unit configured to pack test mode select signal and test data input in synchronization with a test clock signal into packages to be sent.

4. A system as claimed in claim 2, wherein the test mode select signal and test data input are configured to be packed in such a manner that one clock signal sequence is illustrated by a two-bit presentation comprising the values of the test mode select signal and the test data input at the rising edge of the clock signal.

5. A system as claimed in claim 2, wherein the transceiver in said test equipment is configured to generate a test clock signal on the basis of the received test mode select signal and test data input.

6. A system as claimed in claim 5, wherein the transceiver in said test equipment comprises a local oscillator, configured to be synchronized on the basis of the received test mode select signal and test data input and by means of which the test clock signal is configured to be generated.

7. A system as claimed in claim 1, wherein the transceiver in said test equipment comprises a receiver for receiving the test data output sent from the device under test and a decoder for distinguishing the received test data output from the data transmission protocol used on the transmission path.

8. A system as claimed in claim 1, wherein the transceiver in said device under test comprises a receiver for receiving the test mode select signal and the test data input sent from the test equipment and a decoder for distinguishing the received test mode select signal and test data input from the data transmission protocol used on the transmission path.

9. A system as claimed in claim 1, wherein the transceiver in said test equipment comprises delay creation means for creating delay to the test data output received from the device under test to achieve said interface synchronization.

10. A system as claimed in claim 9, wherein
said delay is configured to be adjusted on the basis of at least one of the following parameters: transmission path delay and a variation thereof, test data encoding/decoding delay, test data output synchronization delay, delay caused by the device under test, buffering delay of the testing.

11. A system as claimed in claim 9, wherein
the delay creation means comprise a buffer for buffering the test data output received from the device under test and a counter synchronized with a test clock signal, the counter being provided with a threshold value responsive to said delay, and when the threshold value is exceeded the buffer is configured to release the buffered test data output to said interface.

12. A system as claimed in claim 9, wherein
the delay creation means comprise software means for programming the required delay to the description of the device under test in the test equipment in such a manner that the test equipment assumes that the testing of the device under test lasts longer than what the actual configuration of the device under test requires.

13. A system as claimed in claim 1, wherein
an additional communication protocol is configured to the system between said test equipment and said device under test, the communication protocol allowing to change the data signalling between said test equipment and said device under test to JTAG testing and vice versa.

14. A transceiver configured to the transmission path side of the JTAG test equipment, the transceiver being configured to arrange the test data to be sent from the interface according to the JTAG definition into a mode appropriate for an asynchronous transmission path and correspondingly to arrange the test data to be received from the asynchronous transmission path into a synchronized mode required by said interface.

15. A transceiver as claimed in claim 14, wherein
the transceiver is configured to send test mode select signal and test data input to the transmission path and to synchronize the test data output received from the device under test in synchronization with a test clock signal required by said interface.

16. A transceiver as claimed in claim 15, wherein
the transceiver comprises a packing unit configured to pack test mode select signal and test data input in synchronization with the test clock signal to be sent to the packages.

17. A transceiver as claimed in claim 15, wherein
the test mode select signal and test data input are configured to be packed in such a manner that one clock signal sequence is illustrated by a two-bit presentation comprising the values of the test mode select signal and test data input at the rising edge of the clock signal.

18. A transceiver as claimed in claim 14, wherein
the transceiver comprises delay creation means for creating delay to the test data output received from device under test to achieve said interface synchronization.

19. A transceiver as claimed in claim 18, wherein
said delay is configured to be adjusted on the basis of at least one of the following parameters: transmission path delay and a variation thereof, test data encoding/decoding delay, test data output synchronization delay, delay caused by the device under test, buffering delay of the testing.

20. A transceiver as claimed in claim 18, wherein
the delay creation means comprise a buffer for buffering the test data output received from the device under test and a counter synchronized with a test clock signal, the counter being provided with a threshold value responsive to said delay, and when the threshold value is exceeded the buffer is configured to release the buffered test data to said interface.

* * * * *